(12) United States Patent
Hynecek et al.

(10) Patent No.: US 7,791,113 B2
(45) Date of Patent: Sep. 7, 2010

(54) CMOS IMAGE SENSOR AND PIXEL OF THE SAME

(76) Inventors: Jaroslav Hynecek, 905 Pampa Dr., Allen, TX (US) 75013; Hyung-Jun Han, 1 Hyangjeong-dong, Heungbuk-gu, Cheongju-si, Chungcheongbuk-do, 361-725 (KR)

( * ) Notice: Subject to any disclaimer, the term of this patent is extended or adjusted under 35 U.S.C. 154(b) by 180 days.

(21) Appl. No.: 12/155,181

(22) Filed: May 30, 2008

(65) Prior Publication Data

US 2008/0296630 A1    Dec. 4, 2008

(30) Foreign Application Priority Data

Jun. 1, 2007    (KR) .................. 10-2007-0053867

(51) Int. Cl.
*H01L 27/148* (2006.01)
*H01L 29/768* (2006.01)

(52) U.S. Cl. ............... 257/239; 257/292; 257/E27.162; 348/223.1; 348/272

(58) Field of Classification Search ............ 257/239, 257/292, E27.162; 348/223.1, 272, 231.99
See application file for complete search history.

(56) References Cited

U.S. PATENT DOCUMENTS

| 5,625,210 | A | 4/1997 | Lee et al. | |
|---|---|---|---|---|
| 6,657,665 | B1 | 12/2003 | Guidash | |
| 7,186,595 | B2* | 3/2007 | Kamashita et al. | 438/144 |
| 2008/0211940 | A1* | 9/2008 | Hynecek | 348/250 |

FOREIGN PATENT DOCUMENTS

| KR | 2005-0115813 | 12/2005 |
|---|---|---|
| KR | 2006-0022701 | 3/2006 |

* cited by examiner

*Primary Examiner*—Phuc T Dang
(74) *Attorney, Agent, or Firm*—McAndrews, Held & Malloy, Ltd.

(57) ABSTRACT

A pixel of an image sensor includes a gate insulation layer formed over a substrate doped with first-type impurities, a transfer gate formed over the gate insulation layer, a photodiode formed in the substrate at one side of the transfer gate, and a floating diffusion node formed in the substrate at the other side of the transfer gate, wherein the transfer gate has a negative bias during a charge integration cycle.

20 Claims, 2 Drawing Sheets

CMOS IMAGE SENSOR AND PIXEL OF THE SAME

CROSS-REFERENCE TO RELATED APPLICATIONS

The present invention claims priority of Korean patent application number 10-2007-0053867 filed on Jun. 1, 2007, which is incorporated by reference in its entirety.

BACKGROUND OF THE INVENTION

The present invention relates to solid-state image sensors, and more particularly to a complementary metal-oxide-semiconductor (CMOS) image sensor having a pinned photodiode for light sensing and incorporating a charge transfer gate for transferring signal charge from the photodiode to a floating diffusion node. More specifically, the present invention relates to pixels using a correlated double sampling operation for minimizing kTC reset noise, incorporating blooming control therein, and having a very low dark current.

The typical image sensors sense light by converting impinging photons into electrons that are integrated in sensor pixels. After completing an integration cycle, collected charge is converted into a voltage, which is supplied to output terminals of the image sensor.

In typical CMOS image sensors, charge to voltage conversion is accomplished directly in pixels and an analog pixel voltage is transferred to output terminals through various pixel addressing and scanning schemes. The analog signal can also be converted to a digital equivalent on chip prior to reaching the chip output. A buffer amplifier, typically a source follower, is integrated in the pixel and drives the sense lines connected to the pixels by an addressing transistor.

After completing the charge to voltage conversion and transferring the signal out from the pixels, the pixels are reset in order to be ready for accumulation of new charge. With respect to pixels using a floating diffusion (FD) as a charge detection node, the reset is accomplished by turning on a reset transistor and momentarily conductively connecting the FD node to a reference voltage. Collected charge in the FD node is removed during the reset operation. However, kTC reset noise, as is well known in the art, is generated in the process of removing the collected charge in the FD node. kTC reset noise is removed by a correlated double sampling (CDS) signal processing technique in order to obtain a desired low noise performance.

The typical CMOS image sensors utilizing the CDS concept need to have four transistors (4T) in a pixel. One of the transistors is a charge transfer transistor transferring charge from a photodiode to a FD node. An example of the 4T pixel circuit is shown in the U.S. Pat. No. 5,625,210 issued to Lee.

Recently, a new pixel operating technique has been suggested, wherein only 3T are needed in the pixel. This is achieved by eliminating the addressing transistor from the pixel. Addressing of the pixel with 3T is accomplished by a source follower transistor itself by applying a predetermined bias on the FD nodes that are not selected. The recent description of this concept is shown in an article by Hidekazu Takahashi et al., entitled "A 1/2.7 inch Low-Noise CMOS Image Sensor for Full HD Camcorders," ISSCC Digest of Technical Papers, pp. 510-511, 2007. Eliminating the addressing transistor from the pixel saves a valuable pixel area and also eliminates one control wire for controlling the gate of the addressing transistor.

Another technique for minimizing the number of transistors in a pixel is sharing pixel circuits with a plurality of photodiodes. An example of this design is shown in U.S. Pat. No. 6,657,665 B1 issued to Guidash. Guidash discloses a pixel consisting of two photodiodes located in neighboring rows that share the same circuits.

However, it is still necessary to transfer charge from a photodiode onto a FD node using a charge transfer transistor in all of those designs. The gate region of the charge transfer transistor should be designed such that the pixel performance is not degraded, this includes the charge transfer efficiency, blooming control, and dark current.

FIG. 1 illustrates a cross sectional view of a typical charge transfer transistor, a pinned photodiode and a floating diffusion.

A substrate 101 may be doped with $p^+$-type impurities. A p-type impurity doped epitaxial layer 102 is formed over the $p^+$-type impurity doped substrate 101. A pinned photodiode region including a $p^+$-type impurity doped region 103 and an n-type impurity doped region 104, and a floating diffusion (FD) region 108 are formed in the p-type impurity doped epitaxial layer 102. A charge transfer gate 106 formed by polysilicon is formed over the epitaxial layer 102 and isolated from the p-type impurity doped epitaxial layer 102 by a gate insulation layer 111 that may include a silicon dioxide layer or some other insulation layer. The transfer gate 106 may also include sidewall spacers 105.

The metal interconnection 110 of the transfer gate 106 to a driving signal source is shown only schematically. The charge transfer transistor may also include a lightly doped drain (LDD) region 107. A p-type impurity doped region 109 is formed at an interface between the epitaxial layer 102 and the gate insulation layer 111 ($Si$—$SiO_2$ interface) in order to minimize dark current.

Referring to FIG. 1, the p-type impurity doped region 109 is formed corresponding to a portion of a gate length, and thus most of the dark current generated at the $Si$—$SiO_2$ interface flows into the FD region 108 rather than into the pinned photodiode.

The charge transfer gate is biased at 0 V during the normal operation of a pixel. When it is desirable to transfer charge from the pinned photodiode onto the FD region, the charge transfer gate may be pulsed with a positive pulse. The amplitude of the pulse may typically be the same as $V_{DD}$ bias of the sensor. However, the amplitude of the pulse may also be higher than the $V_{DD}$ bias when a positive charge pumping circuit is integrated on the sensor that can be used for biasing the gate drivers. The available positive amplitude of the transfer gate pulse limits the concentration of impurities that can be placed in the p-type impurity doped region 109 since a threshold voltage ($V_{TX}$) of the transistor increases when the p-type impurities in the p-type impurity doped region 109 increases.

It is necessary that a difference between the $V_{DD}$ and the $V_{TX}$ is larger than a pinning voltage $V_{PIN}$ of the pinned photodiode in order to transfer all collected charge through the gate onto the FD region. Another reason for limiting the concentration of the impurities in the p-type impurity doped region 109 is charge transfer efficiency. The charge transfer efficiency may be reduced by higher concentration of the impurities in the p-type impurity doped region 109.

FIG. 2 illustrates a simplified potential energy band diagram of the typical charge transfer transistor shown in FIG. 1.

A conduction band 205 of an $n^+$-type impurity doped polysilicon, i.e., the transfer gate, is lined up with a Quasi Fermi Level (QFL) 209 and with a valence band 202 of a $p^+$-type impurity doped substrate at zero bias level. A gate insulation region 204 including silicon dioxide is biased by a certain built-in potential difference since the polysilicon is doped with n+-type impurities and the substrate is doped with p+-type impurities. The energy level of the conduction band of silicon substrate is indicated in a drawing in FIG. 2 as 201. A certain voltage difference equal to $\Delta V = E_C - E_V$ is approximately 1.0 V and is divided between the silicon, e.g. the substrate, and the silicon dioxide, e.g. the gate insulation region 204.

A portion of the voltage that is applied to the silicon causes band bending 208 and depopulation of interface states 206 of holes. Due to the depopulation, the interface states 206 generate electrons 207 that flow along the gate length in a direction perpendicular to the drawing into the pinned photodiode and the FD region. This electron flow contributes to dark current.

Portion of the voltage that is applied to the silicon dioxide and to the silicon depends on the thickness of the silicon dioxide and on the concentration of p-type impurities at the interface between the silicon and the silicon dioxide. It is desirable to apply most of the voltage to the silicon dioxide and minimize the band bending at the surface of the silicon. When the concentration of p-type impurities is increased, the band bending is decreased. However, when the concentration of p-type impurities is increased, the threshold voltage is increased and the charge transfer efficiency is decreased as described above. The concentration of the p-type impurities in the interface region 203 between the silicon dioxide and the silicon cannot exceed a maximum that is determined by the threshold voltage allowed in order to have a complete charge transfer.

In modern CMOS image sensors, the thickness of the gate insulation layer $X_{OX}$ 204 is very small and this results in a small voltage drop that can be developed across the gate insulation layer. This is a contradicting requirement for minimizing the band bending. The band bending at the interface between the silicon and the silicon dioxide is limited to a certain minimum value that cannot be further reduced due to both the maximum of the concentration of p-type impurities in the p-type impurity doped region 109 in the interface region 203 and the thin gate insulation layer $X_{OX}$ 204. Therefore, the typical transfer gate transistors have limitations that are difficult to overcome.

However, the band bending can also have a positive consequence, which is the blooming control. A potential well formed at the interface due to the band bending allows the overflow of charge from the photodiode to flow to the FD node, which then does not spread out into the neighboring pixels.

SUMMARY OF THE INVENTION

Embodiments of the present invention are directed to provide a description of complementary metal-oxide-semiconductor (CMOS) image sensor having pixels that use pinned photodiodes and charge transfer transistors, wherein the charge transfer transistor has high charge transfer efficiency, good blooming control, and low dark current.

In accordance with an aspect of the present invention, there is provided a pixel in an image sensor including a gate insulation layer formed over a substrate doped with first-type impurities, a transfer gate formed over the gate insulation layer, a photodiode formed in the substrate at one side of the transfer gate, and a floating diffusion mode formed in the substrate at the other side of the transfer gate, wherein the transfer gate has a negative bias during the charge integration cycle.

In accordance with another aspect of the present invention, there is provided an image sensor including a gate insulation layer formed over a substrate doped with first-type impurities, a transfer gate formed over the gate insulation layer, a photodiode formed in the substrate at one side of the transfer gate, a floating diffusion node formed in the substrate at the other side of the transfer gate, and a negative charge pump circuit integrated on chip to apply a negative bias to the transfer gate during the charge integration cycle.

DESCRIPTION OF SPECIFIC EMBODIMENTS

Figure 3:
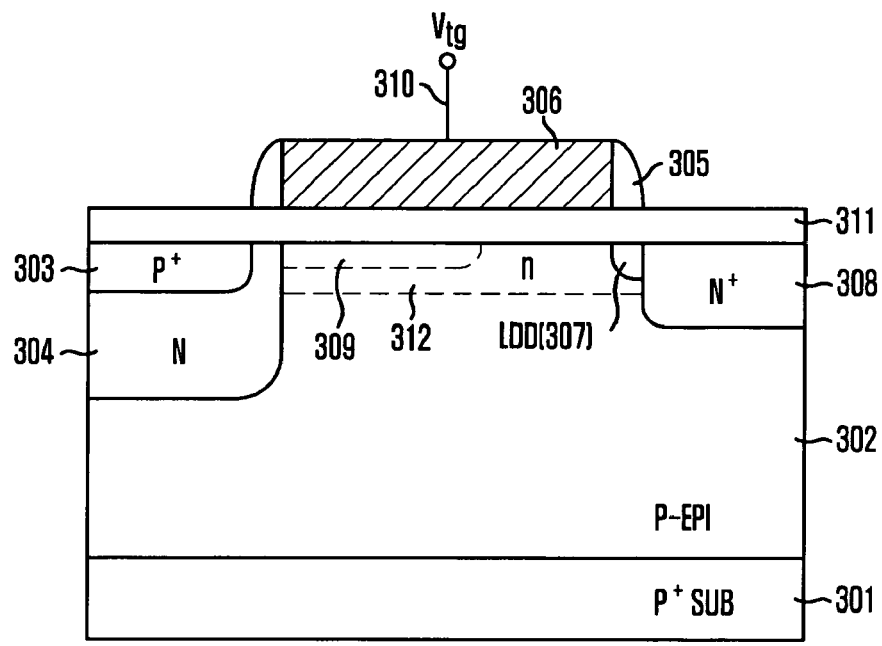
FIG. 3 illustrates a cross sectional view of an image sensor according to an embodiment of the present invention.

FIG. 3 illustrates a cross sectional view of a charge transfer transistor according to an embodiment of the present invention.

A substrate 301 includes an epitaxial layer doped with p+-type impurities. A p-type impurity doped epitaxial layer 302 is formed over the p+-type impurity doped substrate 301.

A pinned photodiode region including a p+-type impurity doped region 303 and a first n-type impurity doped region 304, a charge transfer gate 306 and a floating diffusion (FD) region 308 are formed over the p-type impurity doped epitaxial layer 302. The charge transfer gate 306 may include polysilicon. The charge transfer gate 306 is isolated from the substrate 301 by a gate insulation layer 311 formed by silicon dioxide or some other insulation layer. The transfer gate 306 may also include sidewall spacers 305.

The metal interconnection 310 of the charge transfer gate 306 to a driving signal source is shown only schematically. The charge transfer transistor may include a lightly doped drain (LDD) region 307. A p-type impurity doped region 309 is formed at an interface between the epitaxial layer 302 and the gate insulation layer 311 (Si—SiO$_2$ interface) in order to minimize dark current.

Referring to FIG. 3, the p-type impurity doped region 309 is formed corresponding to a certain portion of a gate length, and thus most of the dark current generated at the Si—SiO$_2$ interface can flow into the FD region 308 rather than into the pinned photodiode.

The charge transfer gate 306 is biased at a small negative bias of approximately –0.5 V during the normal operation of a pixel. The small negative voltage can be easily generated on chip by a certain charge pumping circuit. Such circuits are well known to those skilled in the art.

In another embodiment of the present invention, the transfer transistor further includes a second n-type impurity doped region 312 for blooming control. The blooming control can be also achieved by carefully selecting a gate length and relying on the two-dimensional (2D) punch through effect from the n-type impurity doped FD region 308 and the first n-type impurity doped region 304 of the photodiode. Either method is equally effective to control the blooming. However, the method to control the blooming by doping impurities is merely shown in the drawing as one embodiment of the present invention.

Figure 4:
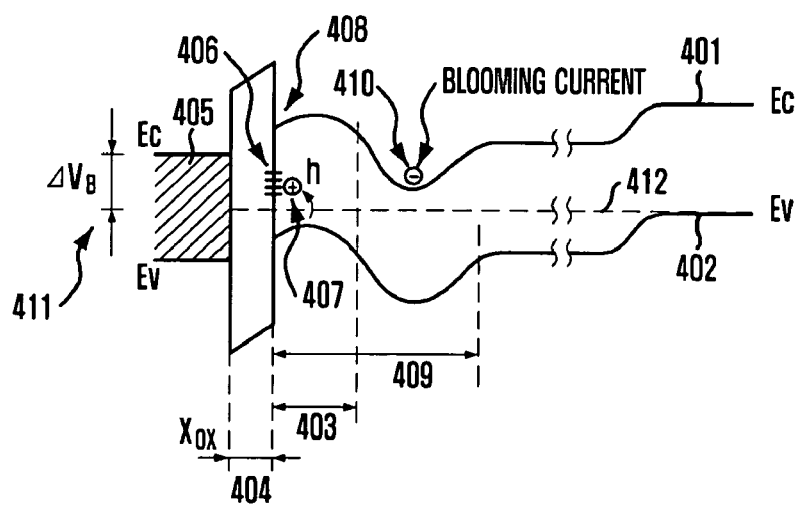
FIG. 4 illustrates a simplified potential energy band diagram of the charge transfer transistor in FIG. 3.

FIG. 4 illustrates a simplified potential energy band diagram of the charge transfer transistor in shown FIG. 3.

A conduction band 405 of an n+-type impurity doped polysilicon, i.e., the transfer gate, is not aligned with a Quasi Fermi Level (QFL) 412 at zero bias level but has a small negative bias 411.

Figure 1:
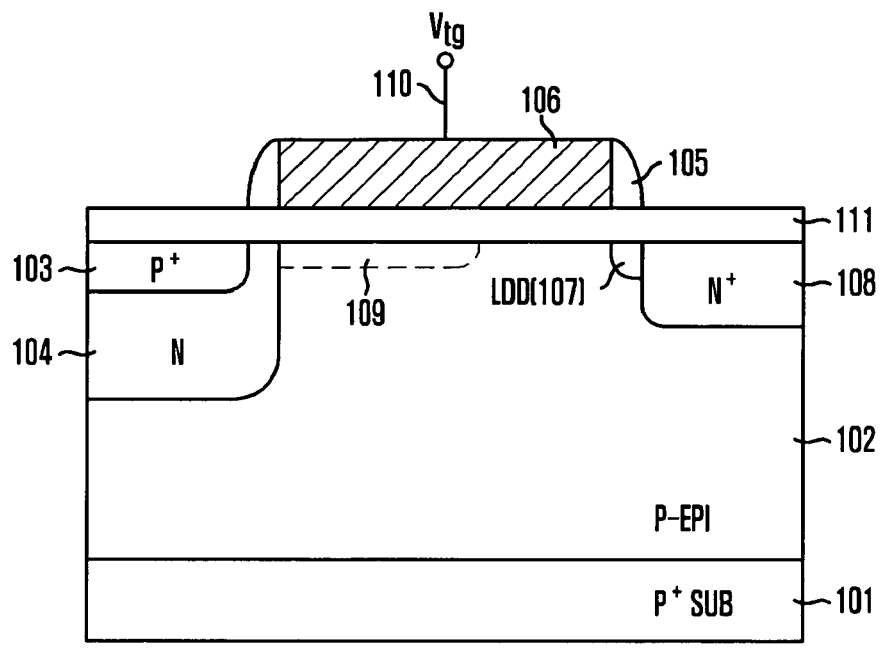
FIG. 1 illustrates a cross sectional view of a typical charge transfer transistor, a pinned photodiode and a floating diffusion.
Figure 2:
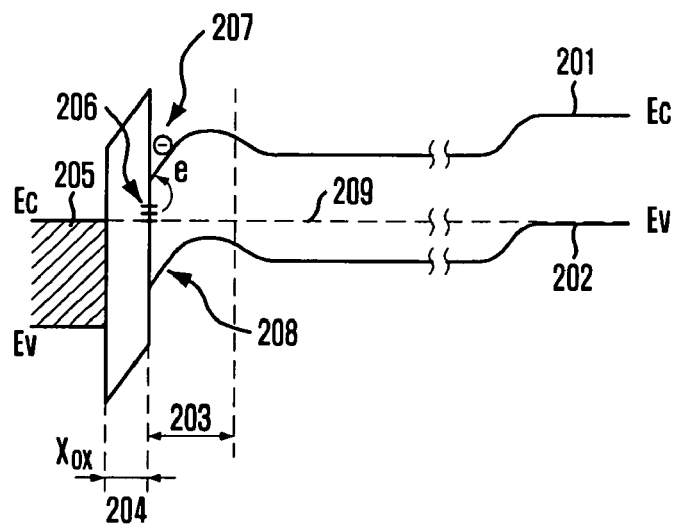
FIG. 2 illustrates a simplified potential energy band diagram of the typical charge transfer transistor in FIG. 1.

A gate insulation region 404 having a certain potential difference has less voltage drop across it than in the previous case shown in FIG. 2 due to the negative bias 411 and due to the increased concentration of p-type impurities in the p-type impurity doped region 309 in a first region 403. Band bending 408 is also significantly smaller than the band bending 208 in FIG. 2. The small band bending 408 results in holes 407 from a valence band 402 to populate interface states 406. Thus, the generation of electrons by the interface states 406 is significantly reduced, which causes a significant decrease of dark current. The energy level of the conduction band of silicon substrate is indicated in a drawing in FIG. 4 as 401.

The second n-type impurity doped region 312 in a second region 409 is added to the transfer transistor in order to maintain a good blooming control of the pixel since a potential well due to the band bending 408 is significantly reduced. The second region 409 causes a new potential well being formed in the bulk of the silicon under the p-type impurity doped region 309 and results in formation of a channel 410 which makes the overflow charge to flow to the FD region 308. The channel 410 can be also formed by other methods, for example by carefully selecting the gate length.

The Quenching of the interface states and the blooming control are independently adjustable by controlling the concentration of impurities and energies for implanting the impurities in the first region 403 and the second region 409 or by carefully selecting the gate length. The decrease of the dark current can be accomplished by selecting suitable doping profiles under the transfer gate together with a small negative bias. The good blooming performance of the pixel can be maintained without decreasing the charge transfer capability.

The present invention relates to an advanced transfer gate transistor which has excellent charge transfer efficiency, good blooming control, and minimum generation of dark current by including an additional n-type impurity doped region under the transfer gate located deeper under, the p-type impurity doped region, and biasing the transfer gate with a small negative bias during a charge integration cycle.

The small negative gate bias reduces the band bending at the interface, but it also reduces the blooming control capability. However, the deterioration of the blooming control capability can be recovered by adding the n-type impurity doped region under the p-type impurity doped region under the transfer gate, which provides a new path for the overflow charge. Adding the n-type impurity doped region under the p-type impurity doped region can also reduce the threshold voltage of the transfer gate, so it is possible to further increase the concentration of the p-type impurities and thus further reduce the band bending at the interface.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A pixel of an image sensor, the pixel comprising:
a gate insulation layer located over a first region in a substrate, wherein the first region is doped with a first type of impurity;
a transfer gate located over the gate insulation layer;
a photodiode located in the substrate proximate to one side of the transfer gate; and
a floating diffusion node located in the substrate proximate to the other side of the transfer gate;
wherein the transfer gate is configured to be negatively biased during a charge integration cycle.

2. The pixel of claim 1, further comprising a second region in the substrate, wherein the second region is doped with a second type of impurity and configured to control blooming.

3. The pixel of claim 2, wherein the second region is further configured to control a threshold voltage of the transfer gate, and wherein a portion of the second region is located proximate to an interface between the gate insulation layer and the substrate.

4. The pixel of in claim 1, wherein the first region is further configured to control a dark current, and wherein a portion of the first region is located proximate to an interface between the gate insulation layer and the substrate.

5. The pixel of claim 4, wherein the first region is positioned to occupy a portion of a length of the transfer gate.

6. The pixel of claim 1, wherein the photodiode comprises a pinned photodiode.

7. The pixel of claim 2, wherein the first type of impurity and the second type of impurity are complementary to each other.

8. The pixel of claim 7, wherein the first type of impurity comprises a p-type impurity and the second type of impurity comprises an n-type impurity.

9. An image sensor on a chip, the image sensor comprising:
a gate insulation layer located over a first region in a substrate, wherein the first region is doped with a first type of impurity;
a transfer gate located over the gate insulation layer;
a photodiode located in the substrate proximate to one side of the transfer gate;
a floating diffusion node located in the substrate proximate to the other side of the transfer gate; and
a negative charge pump circuit integrated on the chip and configured to apply a negative bias to the transfer gate during a charge integration cycle.

10. The image sensor of claim 9, further comprising a second region in the substrate, wherein the second region is doped with a second type of impurity and configured to control blooming.

11. The image sensor of claim 10, further wherein the second region is further configured to control a threshold voltage of the transfer gate, and wherein a portion of the second region is located proximate to an interface between the gate insulation layer and the substrate.

12. The image sensor of claim 9, wherein the first region is further configured to control a dark current, and wherein a portion of the first region is located proximate to an interface between the gate insulation layer and the substrate.

13. The image sensor of claim 12, wherein the first region is positioned to occupy a portion of a length of the transfer gate.

14. The image sensor of claim 9, wherein the photodiode comprises a pinned photodiode.

15. The image sensor of claim 10, wherein the first type of impurity and the second type of impurity are complementary to each other.

16. The image sensor of claim 15, wherein the first type of impurity comprises a p-type impurity and the second type of impurity comprises an n-type impurity.

17. The pixel of claim 1, further comprising a channel configured to permit a flow of overflow charge into a floating diffusion node.

18. The pixel of claim 17, wherein a gate length of the transfer gate is configured to form the channel.

19. The image sensor of claim 9, further comprising a channel configured to permit a flow of overflow charge into a floating diffusion node.

20. The image sensor of claim 19, wherein a gate length of the transfer gate is configured to form the channel.

* * * * *